(12) United States Patent
Sun et al.

(10) Patent No.: US 9,017,765 B2
(45) Date of Patent: Apr. 28, 2015

(54) PROTECTIVE COATINGS RESISTANT TO REACTIVE PLASMA PROCESSING

(75) Inventors: Jennifer Y. Sun, Mountain View, CA (US); Ren-Guan Duan, Fremont, CA (US); Kenneth S. Collins, San Jose, CA (US)

(73) Assignee: Applied Materials, Inc., Santa Clara, CA (US)

( * ) Notice: Subject to any disclaimer, the term of this patent is extended or adjusted under 35 U.S.C. 154(b) by 588 days.

(21) Appl. No.: 12/590,200

(22) Filed: Nov. 3, 2009

(65) Prior Publication Data

US 2010/0129670 A1 May 27, 2010

Related U.S. Application Data

(60) Provisional application No. 61/199,127, filed on Nov. 12, 2008.

(51) Int. Cl.
| | | |
|---|---|---|
| *B05D 3/02* | (2006.01) | |
| *C04B 41/86* | (2006.01) | |
| *C03C 8/00* | (2006.01) | |
| *C04B 41/00* | (2006.01) | |
| *C04B 41/50* | (2006.01) | |

(52) U.S. Cl.
CPC . *C04B 41/86* (2013.01); *C03C 8/00* (2013.01); *C03C 2214/20* (2013.01); *C04B 41/009* (2013.01); *C04B 41/5023* (2013.01)

(58) Field of Classification Search
USPC ...................................... 427/376.1
See application file for complete search history.

(56) References Cited

U.S. PATENT DOCUMENTS

| | | | | |
|---|---|---|---|---|
| 5,541,012 A | * | 7/1996 | Ohwaki et al. | 428/690 |
| 6,139,983 A | | 10/2000 | Ohashi et al. | 428/698 |
| 6,316,377 B1 | | 11/2001 | Fulton et al. | 501/151 |
| 6,383,964 B1 | | 5/2002 | Nakahara | 501/152 |
| 6,447,937 B1 | | 9/2002 | Murakawa et al. | 428/696 |
| 6,776,873 B1 | | 8/2004 | Sun et al. | 156/345.41 |
| 6,783,875 B2 | * | 8/2004 | Yamada et al. | 428/697 |
| 6,789,498 B2 | | 9/2004 | Kaushal et al. | 118/723 |
| 7,655,328 B2 | | 2/2010 | Maeda et al. | 428/701 |
| 7,696,117 B2 | | 4/2010 | Sun et al. | 501/134 |
| 8,034,734 B2 | | 10/2011 | Sun et al. | 501/152 |

(Continued)

FOREIGN PATENT DOCUMENTS

| | | | | |
|---|---|---|---|---|
| EP | 1158072 A2 | 11/2001 | | C23C 16/50 |
| JP | 2001/351966 | 12/2001 | | H01L 21/68 |
| JP | 2002192655 | 7/2002 | | B32B 18/00 |

OTHER PUBLICATIONS

Ring, Fundamentals of Ceramic Powder Processing and Synthesis (c) 1996 Academic Press Inc, p. 609-679.*

(Continued)

*Primary Examiner* — Nathan Empie
(74) *Attorney, Agent, or Firm* — Shirley L. Church, Esq.

(57) ABSTRACT

Embodiments of the invention relate to compositions of metal oxyfluoride-comprising glazes or metal fluoride-comprising glazes, glass ceramics, and combinations thereof which are useful as plasma-resistant solid substrates or plasma resistant protective coatings over other substrates. Also described are methods of fabricating various structures which incorporate such compositions, including solid substrates and coatings over the surface of a substrate which has a melting point which is higher than about 1600° C., such as aluminum oxide, aluminum nitride, quartz, silicon carbide, silicon nitride.

9 Claims, 6 Drawing Sheets

(56) References Cited

U.S. PATENT DOCUMENTS

| | | | |
|---|---|---|---|
| 8,623,527 B2 | 1/2014 | Sun et al. | 428/702 |
| 2007/0071979 A1* | 3/2007 | Komuro et al. | 428/403 |
| 2008/0264564 A1 | 10/2008 | Sun et al. | 156/345.1 |

OTHER PUBLICATIONS

Reed, Principles of Ceramics Processing 2nd ed. (c) 1995 by Joh Wiley & Sons, Inc p. 137-142 and p. 172-189.*

* cited by examiner

PROTECTIVE COATINGS RESISTANT TO REACTIVE PLASMA PROCESSING

FIELD

Embodiments of the invention relate to compositions of metal oxyfluoride-comprising glazes, glass ceramics, and combinations thereof which are useful as plasma-resistant protective solid substrates or plasma resistant coatings over other substrates. In addition, embodiments of the invention relate to methods of applying bulk materials or coatings of the compositions over a substrate to provide various processing components which are useful as part of reactive plasma processing apparatus.

BACKGROUND

This section describes background subject matter related to the disclosed embodiments of the present invention. There is no intention, either express or implied, that the background art discussed in this section legally constitutes prior art.

A glaze is a specialized form of glass and therefore can be described as an amorphous solid. Glazing is the process of coating the part with a layer of glaze. A glass ceramic is a specialized form of ceramics, which is formed first as a glass and then made to crystallize partly through a designed heat treatment which involves controlled cooling.

Unlike traditional sintered ceramics, glass ceramics do not have pores between crystal grains. The spacing between grains is filled with the glass. Glass ceramics share many properties with both glass and traditional crystalline ceramics. After adjusting the composition of glass ceramics by processing technique, the final material may exhibit a number of advanced properties that the traditional ceramics do not have.

Glazes and glass ceramics have long been used to provide protective coatings. To form the protective coatings, typically a powder of an oxide, which may be in combination with a non-oxide, is placed into a suspending medium, to which a binder composition may be added, this combination of ingredients produces a slurry which is applied over a substrate which is to be coated, and then the slurry is sintered under controlled time, temperature and environmental conditions. During sintering, when the fluid coating material is cooled rapidly, typically a glaze is produced; when the coating material is cooled slowly, a glass-ceramic is obtained.

The physical properties of the coating obtained, such as thermal conductivity, thermal expansion coefficient, hardness, and toughness, for example, can be adjusted by changing the composition of the ceramic powder, and/or the processing technique. The thickness of the coating, for a given application process, may be "fine tuned" by adjusting the slurry viscosity, pH, and binder, for example. Depending on the composition of the coating and the substrate, and the application process, a transition layer may be formed between the substrate and portion of the coating which is in contact with the substrate. A transition layer formed in-situ during application of the coating to the substrate surface may provide better chemical bonding between the substrate and the coating and may also dissipate the stress due to thermal expansion difference between the substrate and the coating.

To apply a coating, a slurry containing the ceramic powder, suspension medium, binder and possibly dopants of various kinds is typically applied over the surface of a substrate using a technique known in the art, such as painting, dipping, spraying, screen printing, or spin-on, by way of example. The substrate must be able to withstand the sintering temperature required to form the coating. The coating is then sintered at a sufficient temperature and for a period of time to permit the coating to form. The coating performance in a given application is limited by the composition of the coating and the processing conditions used to apply the coating.

Processing chamber liners and component apparatus present within processing chambers which are used in the fabrication of electronic devices and micro-electro-mechanical structures (MEMS), for example and not by way of limitation, are frequently constructed from ceramics such as aluminum oxide and aluminum nitride. While the plasma erosion resistance for these materials in a fluorine containing plasma of the kind typically used for etching silicon-containing electronic device structures is better than a number of materials which were used in the processing art even 5 years ago, there is constantly an effort to try to improve the erosion resistance of etch processing components, as a means of extending the lifetime of the processing apparatus and of reducing metal contamination and particle formation during device processing. Not only is the processing apparatus very expensive, the production down time caused by the need to replace apparatus which is not functioning well due to erosion is also very expensive.

Solid yttrium oxide component structures have demonstrated considerable advantages when used as semiconductor apparatus components in reactive plasma processing. A yttrium oxide solid component substrate typically comprises at least 99.9% by volume yttrium oxide, has a density of at least 4.92 g/cm$^3$, and a water absorbency of about 0.02% or less. The average crystalline grain size of the yttrium oxide is within a range of about 10 µm to about 25 µm. The co-inventors of the present invention developed a yttrium oxide-containing substrate which includes impurities which are equal to or less than the following maximum concentrations: 90 ppm Al; 10 ppm Ca; 5 ppm Cr; 5 ppm Cu; 10 ppm Fe; 5 ppm K; 5 ppm Mg; 5 ppm Na; 5 ppm Ni; 120 ppm Si; and 5 ppm Ti. This yttrium oxide-comprising substrate provided improvements over substrates previously known in the art. A yttrium oxide-comprising substrate of this general composition which included up to about 10% by volume of aluminum oxide was also developed.

In a reactive plasma etch rate test, where the reactive etchant plasma contains plasma species generated from a plasma source gas of $CF_4$ and $CHF_3$, a solid Yttrium oxide substrate component resists etch by the plasma better than solid aluminum oxide substrate or solid aluminum nitride substrate, but not as well as the components of the present invention either in solid form or as coatings over underlying substrates.

BRIEF DESCRIPTION OF THE DRAWINGS

So that the manner in which the exemplary embodiments of the present invention are attained is clear and can be understood in detail, with reference to the particular description provided above, and with reference to the detailed description of exemplary embodiments, applicants have provided illustrating drawings. It is to be appreciated that drawings are provided only when necessary to understand exemplary embodiments of the invention and that certain well known processes and apparatus are not illustrated herein in order not to obscure the inventive nature of the subject matter of the disclosure.

DETAILED DESCRIPTION OF EXEMPLARY EMBODIMENTS

Figure 1:
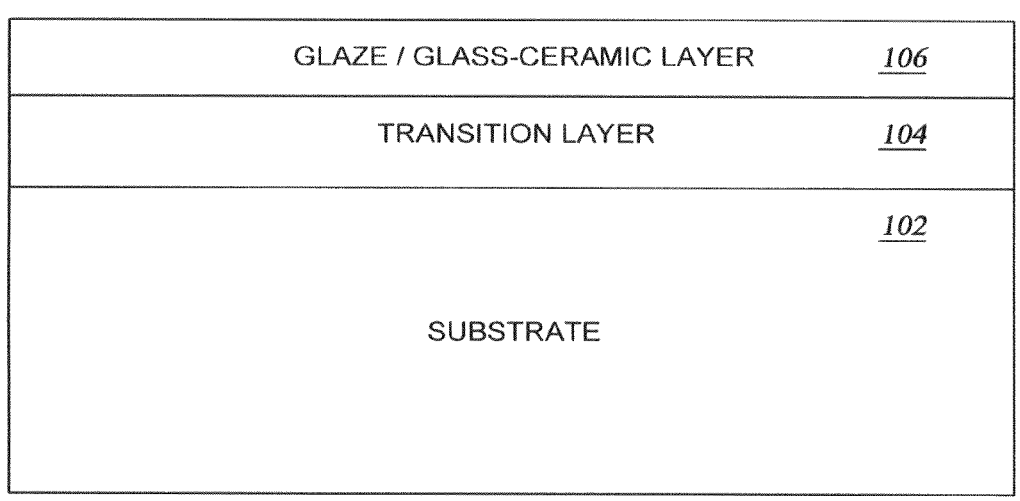
FIG. 1 is a schematic 100 representative of the use of a glaze/glass ceramic as a coating layer over a ceramic substrate such as aluminum oxide or aluminum nitride.

As a preface to the detailed description, it should be noted that, as used in this specification and the appended claims, the singular forms "a", "an", and "the" include plural referents, unless the context clearly dictates otherwise.

When the word "about" is used herein, this is intended to mean that the nominal value presented is precise within ±10%.

The materials and methods described herein are useful in designing and in fabrication of component apparatus parts for semiconductor and MEMS processing equipment. In particular, the materials and methods of fabricating components produce component apparatus which is resistant to halogen plasmas in general and to the fluorine-containing plasmas which are so problematic in terms of reaction with and erosion of surfaces of the components. Example component parts of the kind which particularly benefit from the materials and methods described herein include plasma processing chamber apparatus such as shower heads for gas distribution, process chamber lid interiors, process chamber liners, and electrostatic chuck surfaces, by way of example and not by way of limitation. Use of the materials described herein and the method of fabricating parts from these materials will decrease the amount of particles formed and metal contamination which occurs during the performance lifetime of the component part, and extend the lifetime of the component part as well.

A protective coating composition of the kind described herein is useful over a surface of an aluminum oxide, aluminum nitride, quartz, silicon carbide, silicon nitride, and other ceramic or glass substrates with a melting point higher than about 1600° C. The protective coating is a sintered composition including a yttrium-based fluoride crystal, or a yttrium-based oxyfluoride crystal, or an oxyfluoride amorphous phase, or a combination thereof. The materials which are selected for formation of the coating depend on the plasma resistance and mechanical, thermal, and electrical properties required for a given component. The starting materials typically comprise compound powders, a suspension medium, and a binder. A majority % of the compound powders (typically about 30% by weight or greater) is a yttrium compound, which may be an oxyfluoride, a fluoride, or combinations of these. This majority compound may be doped with a minority component powder, for example, an oxide, fluoride, or oxyfluoride of: neodymium, cerium, samarium, erbium, aluminum, scandium, lanthanum, hafnium, niobium, zirconium, ytterbium, hafnium, and combinations thereof. Properties such as thermal conductivity, thermal expansion coefficient, hardness, toughness, dielectric strength, dielectric constant, loss tangent, electrical resistivity, and erosion resistance will be determined in large part by the compounds selected for combination in forming a sintered coating.

The suspension medium may be selected from water or organic chemicals, including but not limited to methanol and ethanol, and combinations thereof, by way of example. Typically, when the suspension medium is methanol or ethanol, the concentration of this suspension medium in the suspension ranges from about 30 weight % to about 90 weight %. The binder may be selected from polyvinyl alcohol (PVA) and polymeric cellulose ether, or combinations thereof, by way of example and not by way of limitation.

Once the materials have been selected, there are a number of other variables which must be determined. These include the relative weight or volume percentages (or ratios) of the powdered materials, and the size of the starting powdered materials; the relative weight percentage of suspension medium; and the relative weight % of binder. Determination of these variables will affect the properties of the suspension such as the viscosity and the manner in which the suspension may be applied over a substrate surface. All of these variables affect the properties including thickness of the coating on the substrate prior to sintering, and ultimately affect the properties including thickness of the sintered coating. The sintering time and temperature profile determines the composition which is formed and the final crystalline structure of the sintered coating. As was discussed initially, when the cooling rate is fast, a glaze is formed, and when the cooling rate is slow, a glass-ceramic is formed. In addition, the ambient environment (atmosphere) in which the sintering takes place may introduce additional elements into the coating surface. For example, when oxygen is present in the sintering atmosphere, oxygen will be introduced into the sintered body. The time and temperature profile of the sintering will affect the depth to which the oxygen penetrates into the coating and the compounds which are formed. Initially, a large amount of empirical work was required to establish the guidelines from which satisfactory products of the present invention were produced.

The thickness of the sintered coating may be adjusted by changing the slurry viscosity, which depends on the variables discussed above and also on the final pH of the slurry, which may be adjusted by adding an acid or a base.

A glass-ceramic structured coating makes possible adjustment of the coefficient of expansion, so that the difference between the substrate and the coating approaches zero. However, in cases where other desired properties would be sacrificed in an attempt to reduce the coefficient of expansion difference, we have discovered that by controlling the variables discussed above, it is possible to produce, in-situ, a transition area between the substrate and the coating. The transition area may be used to dissipate the stress due to differential in thermal expansion between the substrate and the coating. In addition, the transition area may be used to provide a stronger bond between the substrate and the coating. The glass-ceramic structured coating comprises at least one yttrium-based fluoride crystal phase or at least one yttrium-based oxyfluoride crystal phase in combination with at least one amorphous phase. Typically the amorphous phase comprises yttrium and fluorine.

Exemplary Slurry Compositions and Methods of Applying a Coating of Glass/Glass-Ceramic Over a Ceramic Substrate To establish the boundaries of variables which should be adjusted, two systems were selected for illustration in examples. The first system is a pure $YF_3$ powder system. The second system is a $YF_3$—$NdF_3$ doped powder system. The suspension media used was ethanol. There was no binder used during sintering of the powder compositions which were sintered in the embodiment examples described herein. As an alternative to the described embodiments, the suspension media could be water, used in combination with a polyvinyl alcohol (PVC) binding agent, for example and not by way of limitation.

Example One

FIG. 1 is a schematic 100 representative of the use of a glaze/glass ceramic as a coating layer over a ceramic substrate such as aluminum oxide or aluminum nitride. FIG. 1 shows the coating 106 overlying a transition layer (transition area) 104, which overlies the substrate 102. In Example One, the substrate was aluminum oxide, $Al_2O_3$, but one of skill in the art will recognize that the substrate could be AlN. The powder used to form the glaze/glass-ceramic coating layer 106 was pure $YF_3$. We discovered that a different sintering time and temperature profile led to different phase compositions for the sintered coating. The sintering was carried out in flowing argon protective gas at atmospheric pressure. The glass ceramic coating described in this example was sintered from pure $YF_3$ powder having an average powder size of about 100 nm. Powder having an average particle size within the range of about 30 nm up to about 1 µm may be used. The $YF_3$ powder was suspended in an ethanol suspension media, where the weight % $YF_3$ powder was about 30%, and the weight % ethanol in the suspension was about 70%. As previously mentioned, as an alternative, the suspension media may be water where a binder is used. A binder such as PVA works well. The coating was applied over an aluminum oxide substrate using a dipping technique of the kind known in the art. The substrate can be dipped in the suspension a number of times to achieve a desired coating thickness. In the present instance, the coating thickness prior to sintering was about 100 µm.

Figure 6:
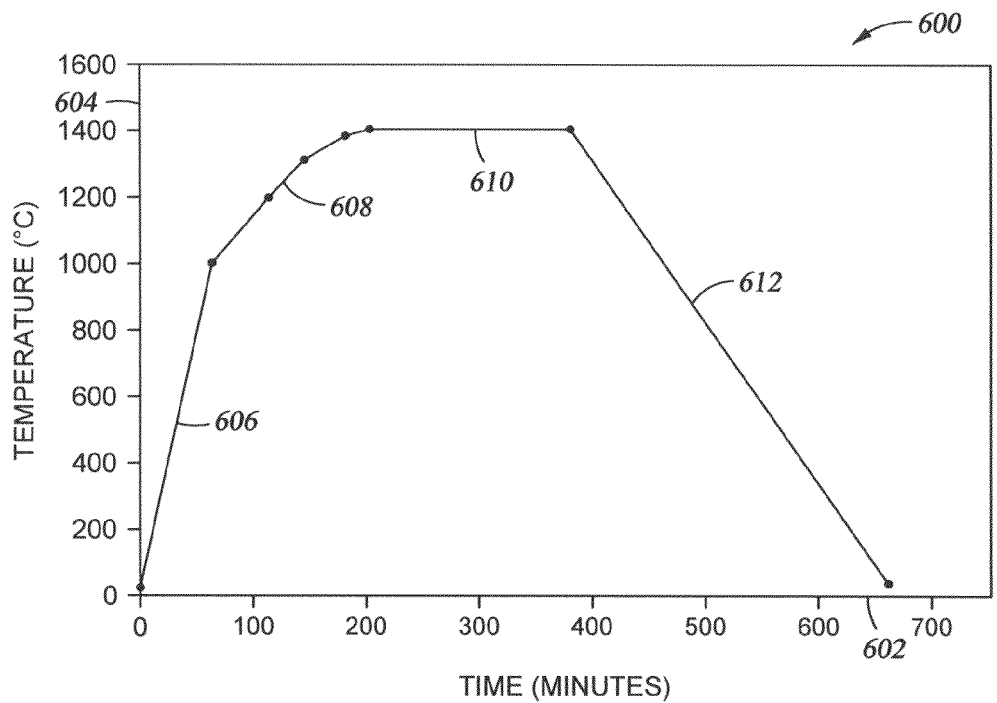
FIG. 6 shows a sintering profile 600 for a coating of yttrium oxyfluoride glass ceramic applied over an aluminum oxide substrate. The sintering time is shown in minutes on axis 602 and the temperature is shown on axis 604.

The sintering process was carried out in flowing argon protective gas at atmospheric pressure. The sintering time/temperature profile for the coating present over an aluminum oxide substrate having a thickness of about 25 µm is shown in FIG. 6. The graph 600 shows the time period in minutes on axis 602 and the temperature in ° C. on axis 604. As indicated, the substrate with coating applied was rapidly increased in temperature at a linear rate from room temperature to 1000° C. over a time period of about 60 minutes as illustrated in area 606. The heating rate was then slowed, as indicated by region 608 of the curve, during which the temperature was increased from 1000° C. to 1410° C. over a time period of about 140 minutes. The sintering was then held at a constant temperature of 1410° C. as illustrated in area 610 of the curve for a time period of about 180 minutes. Finally, the coated substrate was cooled at a linear rate from 1410° C. to room temperature over a time period of about 275 minutes, as indicated by region 612 of the curve. The thickness of the sintered coating produced was about 25 µm.

Four crystal phases were found in the x-ray diffraction of the glass-ceramic coating structure which was sintered at 1410° C. The coating layer composition near and at the coating surface included YOF and $Y_2O_3$. There was a transition area between the coating and the aluminum oxide substrate which was $AlF_3$, followed by $Al_2O_3$ adjacent to and in contact with the substrate. There is about 22 molar % of Y—Al—O—F amorphous phase distributed between crystal grains in the surface layer and the transition layer. The Composition of Phases, Phase Composition %, and Grain Size for the coating structure are shown below in Table One.

TABLE ONE

| Composition | Phase Composition molar % | Grain Size (nm) |
|---|---|---|
| Amorphous Y—Al—O—F | 22.04 | — |
| $Y_2O_3$ | 3.79 | 18.6 |
| YOF | 41.58 | 46 |
| $AlF_3$ | 3.89 | 2.9 |
| $Al_2O_3$ | 28.7 | >100 |

Example Two

Figure 7:
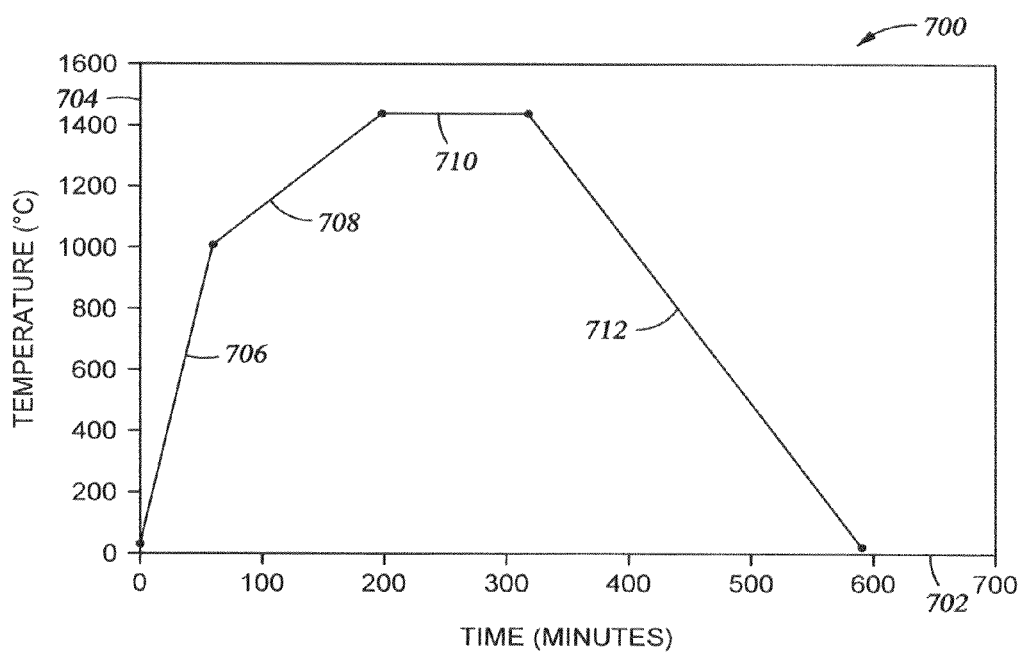
FIG. 7 shows a sintering profile 700 for a coating of neodium fluoride doped yttrium oxyfluoride glass ceramic applied over an aluminum oxide substrate. The sintering time is shown in minutes on axis 702 and the temperature is shown on axis 704.

The composition of the starting suspension was the same for Example Two as described for Example One. The thickness of the unsintered coating on the substrate was about 100 µm. The sintering was carried out in flowing argon protective gas at atmospheric pressure. The sintering time/temperature profile is shown in FIG. 7. The graph 700 shows the time period in minutes on axis 702 and the temperature in ° C. on axis 704. As indicated, the substrate with coating applied was rapidly increased in temperature at a linear rate from room temperature to 1000° C. over a time period of about 58 minutes as illustrated in area 706. The heating rate was then slowed, as indicated by region 708 of the curve, during which the temperature was increased from 1000° C. to 1430° C. over a time period of about 145 minutes. The sintering was then held at a constant temperature of 1430° C. as illustrated in area 710 of the curve for a time period of about 120 minutes. Finally, the coated substrate was cooled at a linear rate from 1430° C. to room temperature over a time period of about 265 minutes, as indicated by region 712 of the curve. The thickness of the sintered coating produced was about 25 µm.

Five crystal phases were found in the x-ray diffraction of the glass-ceramic coating structure. The coating layer included YOF, $Y_2O_3$, and crystalline $YF_3$. There was a transition area between the coating and the aluminum oxide substrate which was $AlF_3$, followed by $Al_2O_3$ adjacent to the substrate. X-ray diffraction was unable to detect an amorphous phase in this glass ceramic, indicating that the amorphous phase content is lower than 1% by weight. The Phase Composition and Grain Size analyzed by XRD for the coating structure are shown below in Table Two.

TABLE TWO

| Composition | Phase Composition molar % | Grain Size (nm) |
|---|---|---|
| Amorphous Y—Al—O—F | 0.0 | — |
| $Y_2O_3$ | 11.46 | 17.5 |
| YOF | 37.43 | >100 |
| $YF_3$ | 18.1 | >100 |
| $AlF_3$ | 23.88 | 58.6 |
| $Al_2O_3$ | 9.13 | 59.4 |

The sintering profile, including heat up rate and cool down rate were the same as for Example One. However, the sintering temperature increase to 1430° C., and the reduction in dwell time to 2 hours had a very significant and surprising effect on the overall structure of the coating. FIG. 7 shows the sintering conditions, which produced a coating where there is no amorphous material present, and the grain sizes of the various compounds is significantly altered. For example, the grain size of the YOF phase increased from about 46 nm to greater than 100 nm. The $YF_3$ crystalline phase did not form in the previous sintering profile where the maximum temperature was 1410° C., but did form when the sintering profile where the maximum temperature was 1430° C. The grain size for $YF_3$ crystalline phase was greater than 100 nm. The $AlF_3$ grain size has increased from 2.9 nm to 58.6 nm. While the grain sizes of all of these crystalline components increased, the grain size of the $Al_2O_3$ crystalline component decreased from greater than 100 nm to about 59.4 nm. The difference in composition of the resulting glass-ceramic coating produced was surprising, in terms of the amount of shifting in phase composition and grain size for the various phases. In addition, the transition area from the substrate to the coating has significantly changed, where the composition of the transition area has become mainly $AlF_3$ (23.88% $AlF_3$ and 9.13% $Al_2O_3$) compared with the transition area of the coating discussed in Example One, where the transition area was mainly $Al_2O_3$ (28.7% $Al_2O_3$ and 3.89% $AlF_3$). This difference in composition led to the different thermal and mechanical properties of the transition layer.

This change in the transition area determines both the ability of the coating to withstand temperature fluctuations which cause stress due to differences in coefficient of expansion between the substrate. The stresses created can cause cracking of the coating, as will be discussed subsequently.

Example Three

Figure 2A:
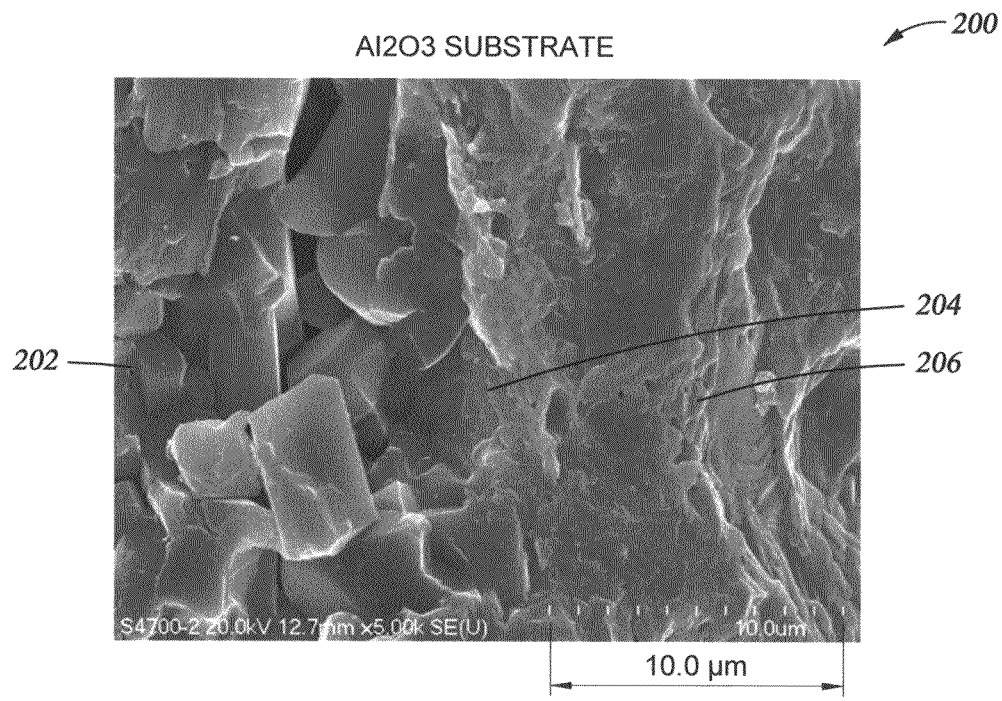
FIG. 2A shows a photomicrograph 200 illustrating the crystal structure of an aluminum oxide substrate 202 directly adjacent a transition area 204, which is directly adjacent a yttrium fluoride glass ceramic 206.
Figure 2B:
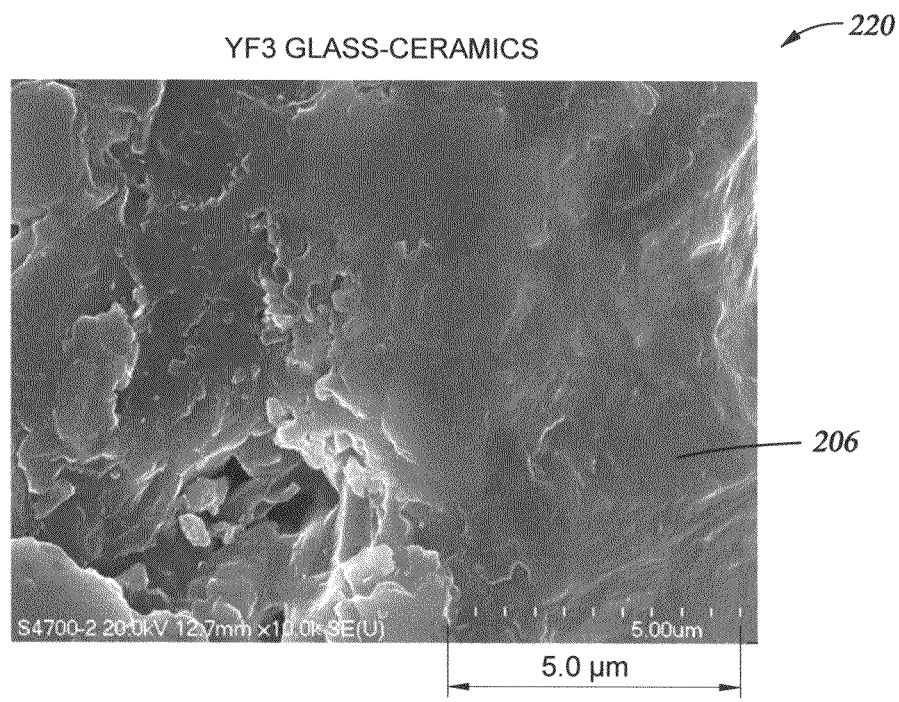
FIG. 2B shows a photomicrograph 220 illustrating the crystal structure of the yttrium fluoride glass ceramic 206 at a magnification which is two times that shown in FIG. 2A.

FIGS. 2A and 2B show photomicrographs which illustrate the fracture surface observation for a coated aluminum oxide substrate which was produced in the manner described in Example One. In FIG. 2A, the structure 200 includes the aluminum oxide substrate 202 which is comprised of crystals which demonstrate obvious porosity potential. The average crystal size of the aluminum oxide is greater than 100 nm. In direct contact with these crystals is transition area 204. Transition area 204 comprises some aluminum oxide adjacent the aluminum oxide substrate 202, but extending away from the substrate is an $AlF_3$ composition which has a much smaller crystal size, on the average of about 2.9 nm. This smaller crystal is able to provide a more densely packed structure, as shown in the photomicrograph. Moving away from the transition area 204 is the coating layer 206 which includes a combination of $Y_2O_3$ and YOF. The average crystal size of the $Y_2O_3$ is about 18.6 nm and the average crystal size of the YOF is about 46 nm. The presence of the amorphous Y—Al—O—F phase, which acts as a matrix to surround the $Y_2O_3$ and YOF crystals provides an impervious coating. FIG. 2B shows a photomicrograph of structure 220, where the coating 206 is the $Y_2O_3$ and YOF crystal grains interspersed with amorphous Y—Al—O—F phase, shown at a magnification of 2× the magnification shown for area 206 in FIG. 2A. The finished coating surface (not shown) is dense and free from loose particulates, as would be expected looking at the non-fractured area 206 toward the right of structure 220.

The oxygen present in the $Y_2O_3$ and YOF crystalline portion of the coating matrix was generally supplied from the oxide substrate. During the sintering process, flowing argon was circulated through the sintering furnace. The $AlF_3$ transition layer was formed according to the following mechanism: The 1410° C. to 1430° C. sintering temperature is higher than the melting temperature of $YF_3$. A Y—Al—O—F melt is formed. However, the melt composition is not homogeneous and, in the area close to the $Al_2O_3$ substrate, there is a higher Al content. During cooling of the melt, the nucleation of $AlF_3$ (heterogeneous) starts in the location of the boundary between the $Al_2O_3$ substrate and the melt, and the growth continues during cooling, to produce the $AlF_3$ crystal grains.

Example Four

In Example Four, the substrate was also $Al_2O_3$, but one of skill in the art will recognize that the substrate could be aluminum oxide or aluminum nitride. The ceramic powder used to produce the coating was a mixture of 80% by weight $YF_3$ and 20% by weight $NdF_3$. Again, we determined that a different sintering time/temperature profile led to different phase compositions for the sintered ceramic coating. The sintering was carried out in flowing argon protective gas at atmospheric pressure. The glass-ceramic coatings sintered from the 80% by weight $YF_3$ and 20% by weight $NdF_3$ mixture were first sintered using the sintering profile described with respect to Example One and illustrated in FIG. 6. The $YF_3$ powder had an average powder size of about 100 nm. The $NdF_3$ powder had an average powder size of about 100 nm. The powders were suspended in an ethanol suspension media, where the weight % of the powder mixture was about 30%, and the ethanol in the suspension was about 70 weight %. The coating was applied over an aluminum oxide substrate using a dipping technique, to produce a resulting unsintered coating thickness over the substrate of about 100 μm.

As previously mentioned, the sintering time/temperature profile for the coating present over an aluminum oxide substrate having a thickness of about 25 μm is shown in FIG. 6.

Five crystal phases were found in the x-ray diffraction of the glass-ceramic coating structure. The coating layer included YOF, $Nd_6O_{11}$, $Nd_4Al_2O_9$, $NdAlO_3$, and $Al_2O_3$. There is about 20 molar % of amorphous Y—Nd—Al—O—F phase distributed between the crystal grains. The YOF and $Nd_6O_{11}$ were from the upper portion of the coating, nearer the surface of the coating. The $NdAlO_3$ and $Nd_4Al_2O_9$ were from the transition layer, and the $Al_2O_3$ was adjacent the $Al_2O_3$ substrate surface. Amorphous Y—Nd—Al—O—F phase was present throughout the upper portion and the transition area of the coating. The Phase Composition and Grain Size analyzed by XRD for the coating structure are shown below in Table three.

TABLE THREE

| Composition | Phase Composition molar % | Grain Size (nm) |
| --- | --- | --- |
| Amorphous Y—Nd—Al—O—F | 20.26 | — |
| YOF | 23.92 | 5.9 |
| $Nd_6O_{11}$ | 36.27 | 22.2 |
| $NdAlO_3$ | 1.48 | 16.5 |
| $Nd_4Al_2O_9$ | 16.72 | >100 |
| $Al_2O_3$ | 1.35 | 60.9 |

Example Five

The composition of the starting materials were the same for Example Four. The sintering time/temperature profile is shown in FIG. 7, where the coating was sintered at 1430° C. for 120 minutes (2 hours).

Five crystal phases were found in the x-ray diffraction of the glass-ceramic coating structure. The coating layer included YOF and $Nd_2O_3$. There was a transition area between the coating and the aluminum oxide substrate which was $Nd_2.5Y_2.5Al_3O_{12}$, $Nd_4Al_2O_9$, and $AlF_3$, followed by $Al_2O_3$ adjacent to the substrate. There was no amorphous phase indicated. This means that the amorphous phase content is lower than 1% by weight and X-ray diffraction cannot detect a presence. The presence of one Nd—Al—O phase ($Nd_4Al_2O_9$) with one Nd—Y—Al—O phase ($Nd_2.5Y_2.5Al_3O_{12}$) and one $AlF_3$ phase in the transition area between the glass-ceramic coating and the substrate provided particularly strong binding between the coating and the substrate. The surface of the coating remains impervious to erosion despite the fact that X-ray diffraction cannot detect an amorphous phase, as there is still a low content of amorphous phase which makes up the grain boundaries between crystals.

Example Six

In Example Six, the substrate was also $Al_2O_3$, but one of skill in the art will recognize that the substrate could be either aluminum oxide or aluminum nitride. The ceramic powder used to produce the coating was a mixture of 90% by weight $YF_3$ and 10% by weight $NdF_3$. The $YF_3$ powder had an average powder size of about 100 nm. The $NdF_3$ powder had an average powder size of about 100 nm. The powders were suspended in an ethanol suspension media, where the weight % of the powder mixture was about 30%, and the ethanol in the suspension was about 70 weight %. The coating was applied over an aluminum oxide substrate using a dipping technique, to produce an unsintered coating thickness over the substrate of about 100 μm. The sintering process was carried out in flowing argon protective gas at atmospheric pressure using a sintering profile as shown in FIG. 7, where the sintering temperature was 1430° C. for a time period of 120 minutes.

Six crystal phases were found in the x-ray diffraction of the glass-ceramic coating structure. The upper portion of the coating is YOF and $Nd_2O_3$ (or $Nd_6O_{11}$). The transition layer is composed of $Nd_2.5Y_2.5Al_3O_{12}$, $Nd_4Al_2O_9$, and $AlF_3$, with an $Al_2O_3$ phase being present near the surface of the $Al_2O_3$ substrate. There is about 4 molar % of amorphous Y—Nd—Al—O—F phase distributed between crystal grains. The presence of one Nd—Al—O phase ($Nd_4Al_2O_9$) with one Nd—Y—Al—O phase ($Nd_2.5Y_2.5Al_3O_{12}$) and one $AlF_3$ phase in the transition area between the glass-ceramic coating and the substrate provides particularly strong binding between the coating and the substrate. The Phase Composition and Grain Size analyzed by XRD for the coating structure are shown below in Table Four.

TABLE FOUR

| Composition | Phase Composition molar % | Grain Size (nm) |
| --- | --- | --- |
| Amorphous Y—Nd—Al—O—F | 4.48 | — |
| YOF | 11.14 | 7.1 |
| $Nd_2 \cdot 5Y_2 \cdot 5Al_3O_{12}$ | 14.64 | >100 |
| $Nd_4Al_2O_9$ | 10.49 | 77.1 |
| $Nd_2O_3$ | 49.58 | 2.4 |
| $AlF_3$ | 4.47 | 47 |
| $Al_2O_3$ | 5.2 | >100 |

The upper portion of the coating was YOF and $Nd_2O_3$ (or $Nd_6O_{11}$) and amorphous Y—Nd—Al—O—F phase. The transition layer was $Nd_2.5Y_2.5Al_3O_{12}$, $Nd_4Al_2O_9$, $AlF_3$, and amorphous Y—Nd—Al—O—F phase, with an $Al_2O_3$ phase being present near the surface of the $Al_2O_3$ substrate.

Example Seven

Figure 3A:
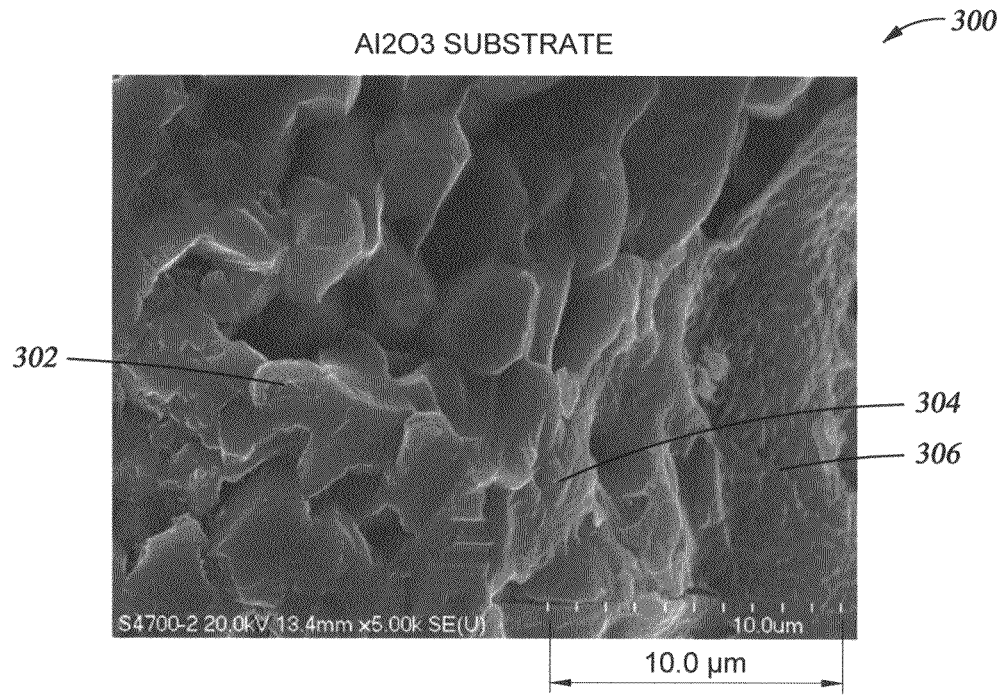
FIG. 3A shows a photomicrograph 300 of the crystalline structure of an aluminum oxide substrate 302 directly adjacent a transition area 304, which is directly adjacent a yttrium fluoride glass ceramic doped with neodymium fluoride 306.
Figure 3B:
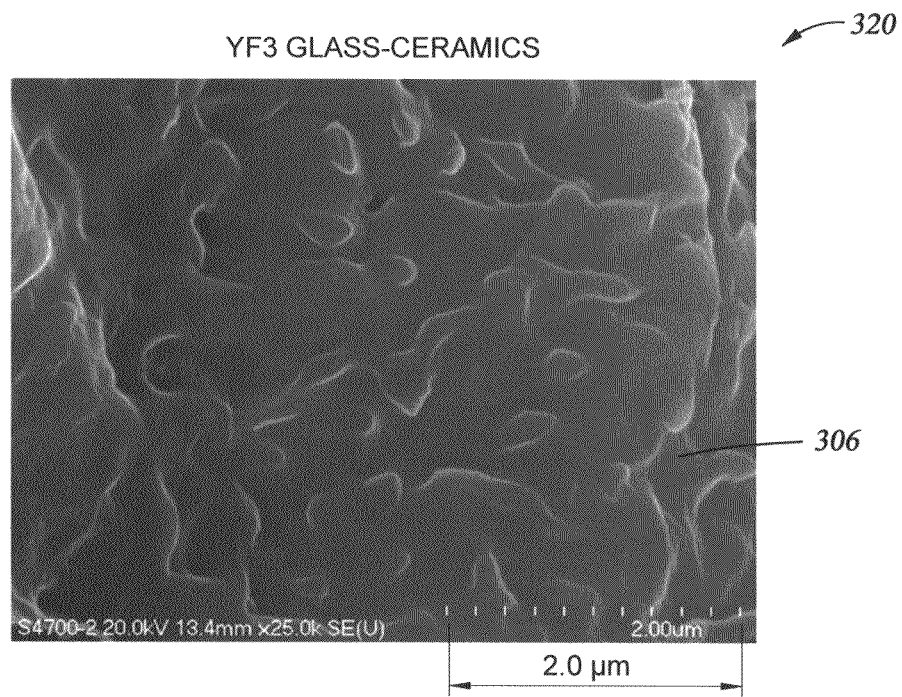
FIG. 3B shows a photomicrograph 320 of the crystalline structure of the neodymium fluoride-doped yttrium fluoride glass ceramic 306 at a magnification which is five times that shown in FIG. 3A.

FIGS. 3A and 3B illustrate the coating structure obtained for a coating of the kind produced as described in Example Six. FIG. 3A shows a photomicrograph of the structure 300, with the $Al_2O_3$ substrate 302, the transition area 304, and the coating 306 having phases of crystalline YOF and $Nd_2O_3$, in combination with amorphous Y—Nd—Al—O—F phase. FIG. 3B shows an enlargement of the coating 306 including the three phases where the magnification is 5× that shown in FIG. 3A.

Figure 5:
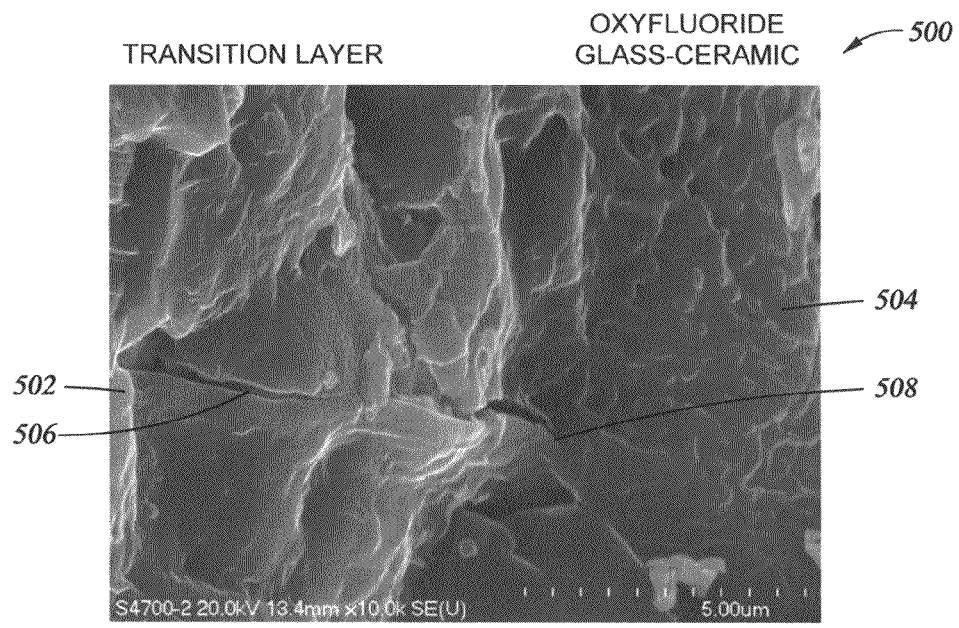
FIG. 5 shows a photomicrograph 500 which illustrates a transition layer 502 directly adjacent an aluminum oxide substrate (not shown on the left), which is directly adjacent a yttrium oxyfluoride glass ceramic 504. A crack 506 passing through transition area 502 stops at the yttrium oxyfluoride glass ceramic coating.

FIG. 5 shows the lower portion of the photomicrograph from FIG. 3A near the area marked with the scale of dimension in μm. The magnification has been increased ×2 from that in FIG. 3A, to show a crack which has progressed through the transition layer and stopped at the upper portion of the coating layer which is the glass-ceramic matrix. The structure 500 illustrated shows the transition area 502, a crack 506 progressing through the transition area 502 and the end of the crack 508 at the point the crack would progress into the glass-ceramic coating 504. This photomicrograph illustrates the ability of the glass-ceramic structure to provide integrity for the coating even when the coating is put under extreme stress, such as when the structure is fractured to provide a photomicrograph sample.

Figure 4:
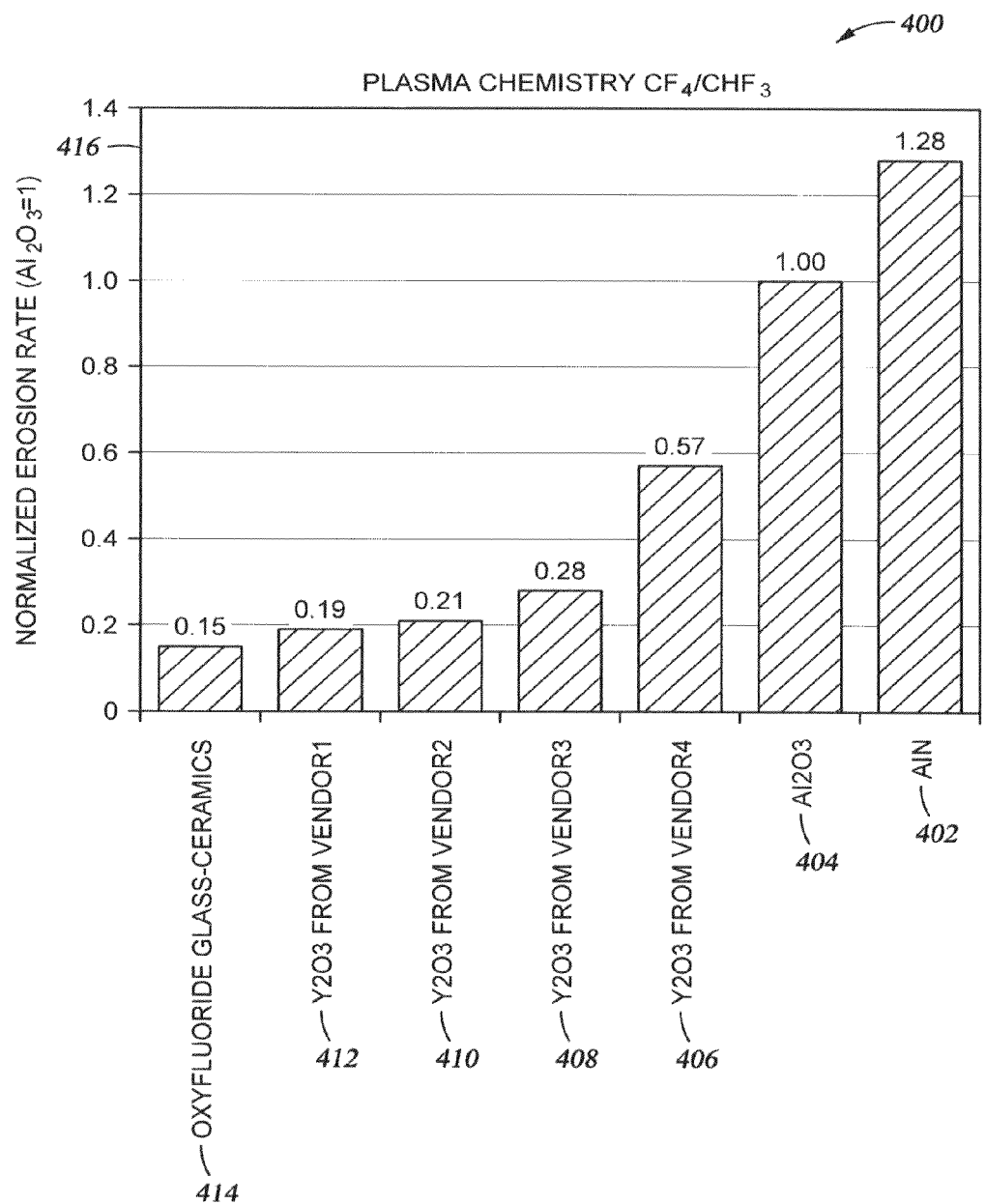
FIG. 4 shows a bar graph 400 which illustrates the relative normalized erosion rates of various solid substrates including aluminum nitride 402, aluminum oxide 404, a series of four yttrium oxides (406, 408, 410, and 412) available from different vendors, and a yttrium oxyfluoride glass ceramic 414.

FIG. 4 shows a bar graph 400 which illustrates the relative normalized erosion rates of various solid substrates including aluminum nitride 402, aluminum oxide 404, a series of three yttrium oxides (404, 408, 410, and 412) available from different vendors, and yttrium oxyfluoride glass ceramic 414. The yttrium oxyfluoride glass-ceramic test specimen was an aluminum oxide substrate protected by a coating of the kind described in Example One, above. The test specimens were processed in an etchant plasma created from a $CF_4/CHF_3$ plasma source gas. The etch processing was of the kind typically used during plasma etching of a silicon substrate. The erosion rate of the yttrium oxyfluoride glass ceramic coating provides better than a 25% improvement over the erosion rate of solid $Y_2O_3$ substrates, better than a 600% improvement over the erosion rate of an $Al_2O_3$ substrate, and better than an 800% improvement over an A/N substrate. This improved erosion rate, combined with the improved mechanical, thermal, and electrical properties described above, and the resistance to cracking under stress illustrated in FIG. 5, supports the inventors' assertion that the materials they have developed provide a surprising improvement over competitive materials previously known in the art.

While the foregoing is directed to embodiments of the present invention, other and further embodiments of the invention may be devised in view of the present disclosure, without departing from the basic scope of the invention, and the scope thereof is determined by the claims which follow.

We claim:

1. A method of forming a protective coating over a surface of a component used in a semiconductor plasma processing apparatus, said protective coating comprising a sintered composition including a yttrium-based oxyfluoride crystal phase, in combination with an oxyfluoride-comprising amorphous phase upon at least one surface of a substrate of said component, said method comprising:
    a) applying a slurry comprising a powder in suspension over said at least one surface of said substrate, wherein said powder comprises yttrium fluoride, and said substrate is selected to have a melting point higher than about 1600° C.; and
    b) sintering said coating present on said substrate surface to produce a sintered coating comprising a yttrium-based oxyfluoride crystal phase, in combination with an oxyfluoride-comprising amorphous phase, where said oxyfluoride-comprising amorphous phase content ranges from about 4.5 molar % to about 22 molar % of said sintered coating composition, whereby said protective coating structure retards crack propagation through said coating;
    wherein said substrate is selected from the group consisting of aluminum oxide, aluminum nitride, quartz, silicon carbide, silicon nitride, or a combination thereof, wherein said sintering is carried out in an oxygen-containing environment, and wherein said powder comprises $YF_3$ at a concentration ranging from about 80 weight % to about 90 weight % in combination with $NdF_3$ at a concentration ranging from about 20% by weight to about 10% by weight, respectively.

2. A method in accordance with claim 1, wherein said powder additionally includes a dopant selected from the group consisting of an oxide, fluoride, or oxyfluoride of neodymium, cerium, samarium, erbium, aluminum, scandium, lanthanum, hafnium, niobium, zirconium, ytterbium, and combinations of an oxide, fluoride or oxyfluoride of at least one of these elements.

3. A method in accordance with claim 1 or claim 2, wherein said slurry comprises said powder suspended in methanol, ethanol, or a combination thereof.

4. A method in accordance with claim 3, wherein a concentration of methanol, ethanol, or a combination thereof in said slurry ranges from about 30 weight % to about 90 weight %.

5. A method in accordance with claim 1 or claim 2, wherein said slurry comprises said powder suspended in water and a water soluble polymeric material.

6. A method in accordance with claim 5, wherein said water soluble polymer is poly vinyl alcohol, polymeric cellulose ether, or a combination thereof.

7. A method in accordance with claim 1 or claim 2, wherein said substrate is aluminum oxide and said slurry is sintered using a dwell time at a temperature ranging from 1400° C. up to less than 1430° C. for a time period ranging from about 120 minutes to about 180 minutes.

8. A method in accordance with claim 1 or claim 2, wherein said concentration of $NdF_3$ is about 20% by weight, and a dwell time at a temperature ranging from 1400° C. to less than 1430° C. is about 180 minutes.

9. A method in accordance with claim 1 or claim 2, wherein said concentration of $NdF_3$ is about 10% by weight, and a dwell time at 1430° C. is about 120 minutes.

* * * * *